Figure 1:
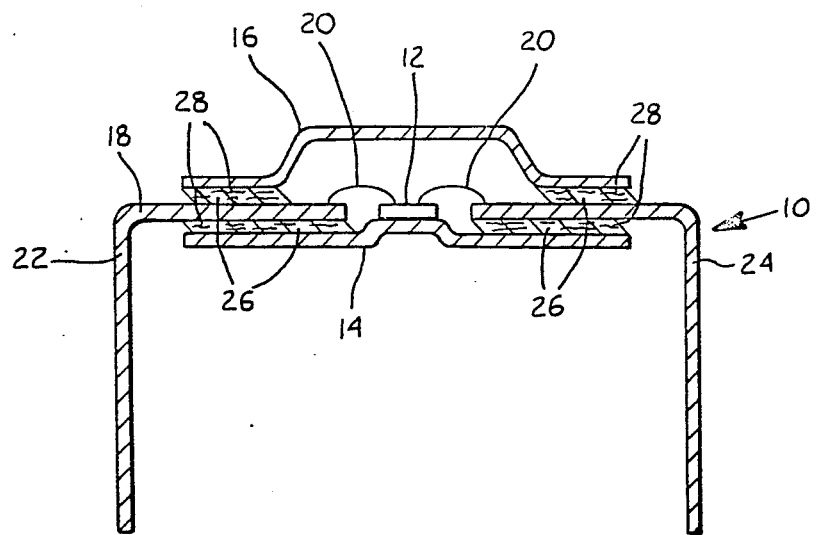

United States Patent [19]

Butt

[11] Patent Number: 4,889,960

[45] Date of Patent: Dec. 26, 1989

[54] SEALED SEMICONDUCTOR CASING

[75] Inventor: Sheldon H. Butt, Godfrey, Ill.

[73] Assignee: Olin Corporation, New Haven, Conn.

[21] Appl. No.: 697,541

[22] Filed: Feb. 1, 1985

Related U.S. Application Data

[62] Division of Ser. No. 477,552, Mar. 21, 1983, Pat. No. 4,532,222.

[51] Int. Cl.$^4$ ............................................. H01L 23/08
[52] U.S. Cl. .................................. 174/52.4; 174/50.61; 428/433; 501/44
[58] Field of Search ......... 174/52 FP, 50.61, 152 GM; 428/432, 433; 501/15, 24, 32, 44, 45

[56] References Cited

U.S. PATENT DOCUMENTS

| | | | |
|---|---|---|---|
| 3,871,018 | 3/1975 | Jackson et al. | 174/52 FP X |
| 4,178,411 | 12/1979 | Cole et al. | 428/451 |
| 4,268,562 | 5/1981 | Bacon et al. | 428/283 X |
| 4,314,031 | 2/1982 | Sanford et al. | 501/44 |
| 4,314,852 | 2/1982 | Brennan et al. | 501/88 |
| 4,341,840 | 7/1982 | Prewo | 428/410 X |
| 4,379,070 | 4/1983 | Tick | 501/44 X |
| 4,461,924 | 7/1984 | Butt | 174/52 FP |

Primary Examiner—A. T. Grimley
Assistant Examiner—David A. Tone
Attorney, Agent, or Firm—Gregory S. Rosenblatt; Paul Weinstein

[57] ABSTRACT

Reinforced glass composites are disclosed which are useful in hermetic semiconductor packaging as well as other applications. The disclosed composites include discrete particles in a tin-phosphorous-oxyfluoride glass mixture having a low glass transition temperature to prevent serious degradation of the discrete particles.

6 Claims, 1 Drawing Sheet

SEALED SEMICONDUCTOR CASING

This is a division of Ser. No. 477,552, filed 3/21/83, now U.S. Pat. No. 4,532,222.

While the present invention is subject to a wide range of applications, it is especially suited for use in hermetic packaging of electronic components. The invention primarily relates to a reinforced glass composite comprised of discrete particles in a tin-phosphorous-oxyfluoride glass matrix and will be particularly described in that connection.

In the semiconductor industry, "high reliability" semiconductor devices are usually hermetically packaged. Hermetic packaging prevents the device from contacting corrosive or otherwise deleterious substances in the operating environment. Although the entire package may be formed of glass, more often glass is used to seal and bond together the ceramic or metal components of a package structure.

Semiconductor devices which do not require the same degree of reliability are non-hermetically packaged by less expensive techniques. Characteristically, the non-hermetic package is an organic polymer, such as plastic, molded around the device with the ends of the leadframe protruding therethrough. Undesirable contaminants including water vapor may diffuse through organic polymers or at the interface of the leadframe and the polymer. Therefore, this non-hermetic type of package provides a lesser degree of protection to the encapsulated electronic device than a comparable hermetic package.

The glasses now used in packaging of semiconductor and other electronic and electrical devices may successfully provide hermetic packaging; however, they also create problems which this invention is intended to overcome or mitigate. For example, the conventional sealing glasses are usually brittle and glass sealed semiconductor packages require special care in handling both during and subsequent to processing. This is necessary to avoid fracture of the glass and resulting loss of package hermeticity. The sealing glasses are relatively expensive and substantially more expensive than the discrete particles, such as organic polymers used in the present invention. The methods of applying the glass to the components to be sealed are generally somewhat tedious and costly. The most common method of applying the glass is to mix finely powdered glass with a suitable vehicle. The mixture is then silk screened in place upon the components. Next, the glass applied component is fired to coalesce the individual glass particles into a continuous glass coating in the areas previously silk screened. At the same time, any residue from the vehicle used during silk screening is driven off.

U.S. Pat. No. 4,314,031 to Sanford et al. discloses tin-phosphorous-oxyfluoride glasses which may be suitable for the present invention. An important quality of these glasses is their very low glass transition temperature, frequently in the region of 100° C. or below. The problem which might arise from the application of the glasses disclosed in this patent to hermetically sealing electronic components is their inherent brittleness and their relative expense.

The present invention has substantially overcome these problems by providing a composite comprising discrete particles mixed into the matrix of sealing glass. The resulting glass composite has non-brittle behavior and is able to readily conform with minimum stress to dimensional changes occurring from factors such as thermal cycling. The addition of the discrete particles to the glass matrix may also decrease the price of the composite. Where the maintenance of hermeticity is important, the glass matrix must be a continuous phase with the discrete particles being completely surrounded by the continuous glass phase.

U.S. Pat. No. 4,314,852 to Brennan et al. discloses silicon carbide fiber reinforced glass composites having high strength, fracture toughness, and oxidative stability, even in high temperature use environments. These composites differ significantly from the present invention because they are directed to high temperature applications. Therefore, the glass has completely different characteristics from the tin-phosphorous-oxide fluoride glass compositions of the present invention. Also, the reinforcing fiber of this patent is specifically set out to be silicon carbide which has both high tensile strength and high temperature capabilities.

U.S. Pat. No. 4,178,411 to Cole et al. discloses, for example, "[a] very low density material is produced by extruding a composition comprising a settable fluid containing long resilient fibres through a narrow die under conditions which cause the extrudate to expand to form an open fibrous structure as it leaves the die, and then causing the fluid to set." This reference is not directed to a glass matrix and does not teach the formation of a composition which is suitable for hermetic sealing of electronic structures. This can be particularly appreciated by noting that FIG. 2, which illustrates the extrudate produced in accordance with this invention, has openings in the matrix 20.

It is a problem underlying the present invention to provide a composite for hermetically sealing an electronic package which is less subject to failure from transient stresses.

It is an advantage of the present invention to provide a reinforced glass composite which obviates one or more of the limitations and disadvantages of the described prior arrangements.

It is a further object of the present invention to provide a reinforced glass composite for hermetically sealing electronic devices which substantially reduce the formation of stresses in the glass due to thermal cycling.

It is a still further advantage of the present invention to provide a reinforced glass composite which may be applied as a sealant in the form of a paste to eliminate the need for solvents or vehicles normally associated with glass sealing.

It is a further advantage of the present invention to provide a reinforced glass composite which is relatively inexpensive to use for hermetically sealing electronic devices.

Accordingly, there has been provided reinforced glass composites which are useful in hermetic semi-conductor packaging as well as other applications. The disclosed composites include discrete particles in a tin-phosphorous-oxyfluoride glass mixture having a low glass transition temperature to prevent serious degradation of the discrete particles.

The invention and further developments of the invention are now elucidated by means of a preferred embodiment shown in the drawing:

FIG. 1 is a cross section of a hermetically sealed electronic package based on the concepts set forth in the present invention.

The present invention is particularly directed to a reinforced glass composite. The addition of the reinforcing material, preferably an organic material, is to impart characteristics such as non-brittle behavior, and a lower modulus of elasticity to the glass matrix to produce a composite which may be particularly useful in hermetic sealing of electronic component packages of the type shown in FIG. 1.

Tin-phosphorous-oxyfluoride glasses of the type described in U.S. Pat. No. 4,314,031 are thought to be particularly suitable for the present invention. The essential constituents of the glass composition are tin, phosphorous, oxygen and fluoride, although elements may be introduced to modify the properties of the resulting glasses. The glasses of this invention are referred to as oxyfluoride glasses because both oxygen and fluoride are present in major proportions. Broadly defined, these glasses comprised in weight percent on an elemental basis as calculated from the batch, about 20–85% Sn, 2–20% P, 3–20% O and 10–36% F. These constituents will normally make up at least about 75% by weight of the glass, with the remainder of the glass being made up of one or more other elements compatible with the glass forming composition. Examples of other elements which may be included in the glass in varying quantities depending upon compatibility are alkali metals such as Na, K and Li, alkaline earth metals such as Ca, Ba, and Mg, other Group II metals such as Zn and Cd, Group III elements such as La, Ce, B and Al, Group IV elements such as Pb, Zr, Ti, Si and Ge, Group V elements such as Sb and Nb, Group VI elements such as Mo and W, Group VII elements such as Cl, Br and I, and Group VIII metals such as Fe and Gd.

A particularly desirable characteristic of many of the glasses in the Sn-P-O-F system is a very low glass transition temperature, frequently in the region of 100° C. or below. Nevertheless, some of these very soft glasses exhibit remarkable resistance to attack by moisture at elevated temperatures, notwithstanding the very low softening temperatures thereof. Other properties which have been observed in glasses of this system are room temperature electrical resistivity values in the range of about $10^7$–$10^{11}$ ohm-cm, refractive index values in excess of 1.7, and thermal expansion coefficients in the neighborhood of $200 \times 10^{-7}/°C$.

The tin-phosphorous-oxyfluoride glass may be quite suitable for low temperature glass to metal sealing for electronic circuit component packages of the type shown in FIG. 1. The glass has a high coefficient of thermal expansion which is close to the coefficient of thermal expansion of metals and alloys such as copper, copper alloys, aluminum and aluminum alloys which are in the range of $170 \times 10^{-7}/°C$. and frequently used in the electronic packaging. Since the glass can bond to these metals or alloys and their coefficients of thermal expansion are relatively close to one another, the glasses may be used to hermetically seal the packages in any conventional manner. The glasses are particularly useful because of their low melting point. This allows the sealing to be done at a low temperature which prevents thermal damage to the electronic device during the packaging procedure. Also, there is a reduction in the typical thermal stresses and resulting glass fractures created in the glass to metal seals associated with electronic component packaging. These stresses are due to the typical glass coefficient of thermal expansion which is about one magnitude lower than the glass matrix of the present invention.

One of the possible deficiencies of this tin-phosphorous-oxyfluoride glass is its relatively low strength. In many applications, this limited strength could be a severe disadvantage. The present invention overcomes this limitation by reinforcing the glass with different types of material to improve its room temperature strength, the toughness of the composite and other advantages which will be described hereinbelow.

Organic fibers or particles may be added to the sealing glass to form the desired composite. It is thought that the percentages of the fiber to glass may be in the range of about 5 to about 25% by volume of the polymer to the glass matrix. More preferably, the maximum volume of the organic polymer to the glass would be about 15%. The range of the volume of the polymer particles to the glass would depend on the particular composition of the particles and how they are wet by the glass. As the percentage of the particles increases, the composite allows for greater expansion without fracture. However, the increase in the area of contact between the diverse surfaces provides more places to initiate failure. The polymers frequently have a coefficient of thermal expansion which is an order of magnitude, i.e. approximately $30-40 \times 10^{-5}/°C.$, greater than the coefficient of thermal expansion of the glass. The resulting mismatch can produce a desirable result increasing the strength of the glass by putting it into compression. The polymers may be high temperature thermoplastics such as polysulfones or high temperature thermosetting substances such as polyimides.

The organic material is preferably provided in a discontinuous phase through the glass matrix. The polymer may take the form of fibers although other geometrical constructions such as approximately equiaxed or substantially spherical may be the preferred embodiment depending on the particular application. When the composite is to be used as a bonding and sealing glass as illustrated in FIG. 1, the polymer may preferably be in the form of fibers. It is quite important to note that substantially all of the fibers must be completely surrounded by the glass matrix which is a continuous phase. This allows the glass to be in continuous contact with the mating surfaces of the package in order to create a hermetic seal. If the fiber were to be in contact with the package surface, it is conceivable that a gap might be present which would render the package non-hermetic.

The process utilized in the present invention to produce the composite comprises the steps of first mixing to a substantially homogeneous state discrete particles and tin-oxyfluoride glass in amounts to give about 5 to 25% particles to glass by volume. These particles, as mentioned above, are preferably made from an organic polymer and are shaped into fibers or spherical particles as desired. The mixture is then heated to a temperature where the glass is substantially fluid, i.e. from about 150° C. to 350° C., and the particles remain solid. A thixotropic mass results with the particles in a continuous matrix of the glass. This thixotropic mass may be used in many ways as described herein.

Referring to FIG. 1, there is illustrated an electronic component casing 10 which embodies certain of the principles set forth within the present invention. The casing 10 comprises a metal base member 14. A metal housing member 16 is mounted upon the base member 14 and shaped to provide a hollow enclosed space for receiving an electronic component 12. A metal lead frame 18 positioned within the enclosed casing 10 is connected by wires 20 to the electronic component 12. The lead frame 18 has terminal leads 22 and 24 projecting between the base member 14 and the housing member 16 external to the casing 10. The terminal leads are sealed and bonded between the base member and the housing member to hermetically seal the casing. This sealing is accomplished with organic fiber reinforced tin-phosphorous-oxyfluoride glass 26. Although the reinforcing polymer is illustrated as having the shape of fibers 28, it is within the scope of the present invention to use any other desired shape such as spherical particles.

Using the glass organic composite as a package sealant provides a number of advantages. The reinforced sealing glass is less brittle than the sealing glass alone and thereby inhibits the fracture of the glass due to stress conditions. For example, the package is less subject to failure from transient stresses due to severe thermal cycling. This advantage arises because of the lower modulus of elasticity of the composite, i.e. closer to that of the polymer, as compared to that of the glass alone. Also, it may be less expensive to manufacture the package since the organic polymers are typically less costly than the sealing glasses. The reinforced glass may be applied at a temperature at which the glass is either a fluid or almost a fluid. This is possible because the low melting temperature of the glass matrix prevent serious degradation of the discrete particles. In this form the glass composite does not require additional solvents or other vehicles normally associated with bonding electronic packages and thereby dispenses with the problems generally associated with the presence of these vehicles. The package is able to stand more bending of the leadframe 18 or terminal leads 22 and 24 without causing failure of the glass to metal seal.

In another embodiment, the organic material of the composite is shaped into approximately spherical particles. The advantage of spherically shaped particles is their ability to slide past each other with a minimum of interference. This reduces the pressure required to work the thixotropic mass. The size, gradation and volume fraction of particles and volume fraction of glass are selected so that at a temperature when the glass is substantially fluid, the polymer particles are still solid. This composite performs a moldable thixotropic mass which may be conveniently "hot worked" which includes molding, forming, rolling, extruding, etc. to provide preforms for use in package sealing. Preforms are small bits of glass powder held together by a heating process which causes the glass to touch but not completely melt. The preforms are rather fragile until they are completely melted, i.e. during the sealing and bonding of a package of the type shown in FIG. 1. Alternatively, the thixotropic mass may be used as an encapsulating package by transfer or injection molding in a manner similar to that presently used in the fabrication of plastic encapsulated semiconductor packages. The advantage of a molded encapsulating package are obtained such as minimal processing costs while the package is hermetic in nature.

In another embodiment, the composite may be formed of tin-oxyfluoride-glass and an inorganic material. This material is similar to the organic material in that it may be formed with different shapes such as fibers or spherical particles, must be substantially surrounded by the glass matrix and must be wettable by the glass matrix. The inorganic material may comprise particles of metals such as copper. This would have the advantage of improving the heat conductivity of the glass which can be quite important in modern electronic packaging applications. Another possibility is to use a high melting point glass for the inorganic fiber which has a coefficient of thermal expansion that does not exceed the coefficient of thermal expansion of the glass matrix by more than about 20%. This prevents the interfacial stresses between the fibers and the glass from becoming too large and causing breakdown of the seal.

The patents set forth in this application are intended to be incorporated by reference herein.

It is apparent that there has been provided in accordance with this invention a reinforced glass composite which fully satisfies the objects, means, and advantages set forth hereinabove. While the invention has been described in combination with the specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. In a casing adapted to house an electronic component comprising:
   a metal base member;
   a metal housing member being mounted upon said base member to provide a hollow enclosed casing for receiving said electronic component;
   a metal leadframe within said enclosed casing for electrical connection to said electronic component, said leadframe having terminal leads projecting between said base member and said housing member external to said casing, the improvement comprising:
   means for sealing and bonding said terminal leads to both said base member and to said housing member whereby a hermetically enclosed casing is formed, said sealing and bonding means comprising;
   about 5 to 25% by volume of discrete particles in a glass matrix;
   said glass matrix being a tin-phosphorous-oxyfluoride composition having a very low glass transition temperature to prevent serious degradation of said discrete particles.

2. The casing of claim 1 wherein said glass matrix comprises in weight percent on an elemental basis as calculated from the batch, about 20–85% Sn, 2–20% P, 3–20% O, 10–36% F and at least 75% total of Sn+P+O+F.

3. The casing of claim 2 wherein said discrete particles are completely surrounded by said glass matrix.

4. The casing of claim 3 wherein said metal is a copper or a copper base alloy.

5. The casing of claim 4 wherein said discrete particles comprise an organic polymer.

6. The casing of claim 4 wherein said discrete particles comprise an inorganic material.

* * * * *